(12) United States Patent
Song et al.

(10) Patent No.: US 12,412,603 B2
(45) Date of Patent: Sep. 9, 2025

(54) FLEXIBLE METADATA ALLOCATION AND CACHING

(71) Applicant: Rambus Inc., San Jose, CA (US)

(72) Inventors: Taeksang Song, San Jose, CA (US); Steven Woo, Saratoga, CA (US); Craig Hampel, Los Altos, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 255 days.

(21) Appl. No.: 18/348,716

(22) Filed: Jul. 7, 2023

(65) Prior Publication Data

US 2024/0013819 A1 Jan. 11, 2024

Related U.S. Application Data

(60) Provisional application No. 63/397,470, filed on Aug. 12, 2022, provisional application No. 63/359,610, filed on Jul. 8, 2022.

(51) Int. Cl.
*G11C 7/10* (2006.01)
*G06F 11/10* (2006.01)
*G06F 12/02* (2006.01)

(52) U.S. Cl.
CPC .......... *G11C 7/1084* (2013.01); *G11C 7/1006* (2013.01); *G06F 11/1064* (2013.01); *G06F 12/0223* (2013.01); *G06F 12/0284* (2013.01)

(58) Field of Classification Search
CPC ............. G06F 11/1064; G06F 12/0223; G06F 12/0284; G06F 12/0292; G06F 12/0868; G06F 12/1408; G06F 12/1441; G11C 7/1006; G11C 7/1084

USPC ...................................................... 365/189.05
See application file for complete search history.

(56) References Cited

U.S. PATENT DOCUMENTS

| | | | |
|---|---|---|---|
| 8,140,746 B2 | 3/2012 | Trichina et al. | |
| 9,183,078 B1 | 11/2015 | Zhu et al. | |
| 9,189,329 B1 | 11/2015 | Zhu et al. | |
| 9,934,194 B2* | 4/2018 | Lowery | G06F 3/0619 |
| 10,540,297 B2 | 1/2020 | Saileshwar et al. | |
| 11,231,991 B2 | 1/2022 | Heo et al. | |
| 11,288,188 B1 | 3/2022 | Tummala et al. | |
| 2006/0031628 A1 | 2/2006 | Sharma | |
| 2013/0166831 A1 | 6/2013 | Atkisson et al. | |
| 2021/0081121 A1* | 3/2021 | Curewitz | G06F 12/1036 |
| 2021/0103388 A1 | 4/2021 | Choi et al. | |
| 2021/0334200 A1 | 10/2021 | Xu | |
| 2021/0405896 A1* | 12/2021 | Durham | G06F 3/064 |

* cited by examiner

*Primary Examiner* — Ly D Pham
(74) *Attorney, Agent, or Firm* — Womble Bond Dickinson (US) LLP

(57) ABSTRACT

An apparatus and method for flexible metadata allocation and caching. In one embodiment of the method first and second requests are received from first and second applications, respectively, wherein the requests specify a reading of first and second data, respectively, from one or more memory devices. The circuit reads the first and second data in response to receiving the first and second requests. Receiving first and second metadata from the one or more memory devices in response to receiving the first and second requests. The first and second metadata correspond to the first and second data, respectively. The first and second data are equal in size, and the first and second metadata are unequal in size.

22 Claims, 7 Drawing Sheets

FLEXIBLE METADATA ALLOCATION AND CACHING

CROSS-REFERENCE TO RELATED APPLICATIONS

This application claims the benefit of U.S. Provisional Application Ser. No. 63/359,610 entitled "FLEXIBLE METADATA ALLOCATION AND CACHING," filed Jul. 8, 2022 and U.S. Provisional Application Ser. No. 63/397,470 entitled "FLEXIBLE METADATA ALLOCATION AND CACHING," filed Aug. 12, 2022, the disclosure of each of which are incorporated herein by reference in their entirety.

BACKGROUND

Data centers often include multiple host computer systems concurrently storing data to a memory system, which often take form in dynamic random access memories (DRAM). Memory controllers interface between hosts and memory systems, and manage data flow therebetween. Each host can implement multiple applications that generate requests to read data from or write data to memory. Memory controllers receive the read and write requests from multiple applications. Memory controllers respond to the requests by accessing memory to read or write data and metadata corresponding to the data using data access protocols.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. In other instances, well-known features are omitted or simplified in order not to obscure the illustrative embodiments.

A data center includes hosts (e.g., server computer systems) in data communication with a memory system via a network. Each host can implement one or more applications (e.g., virtual machines). Each application can generate requests to write data to and read data from the memory system.

Figure 1:
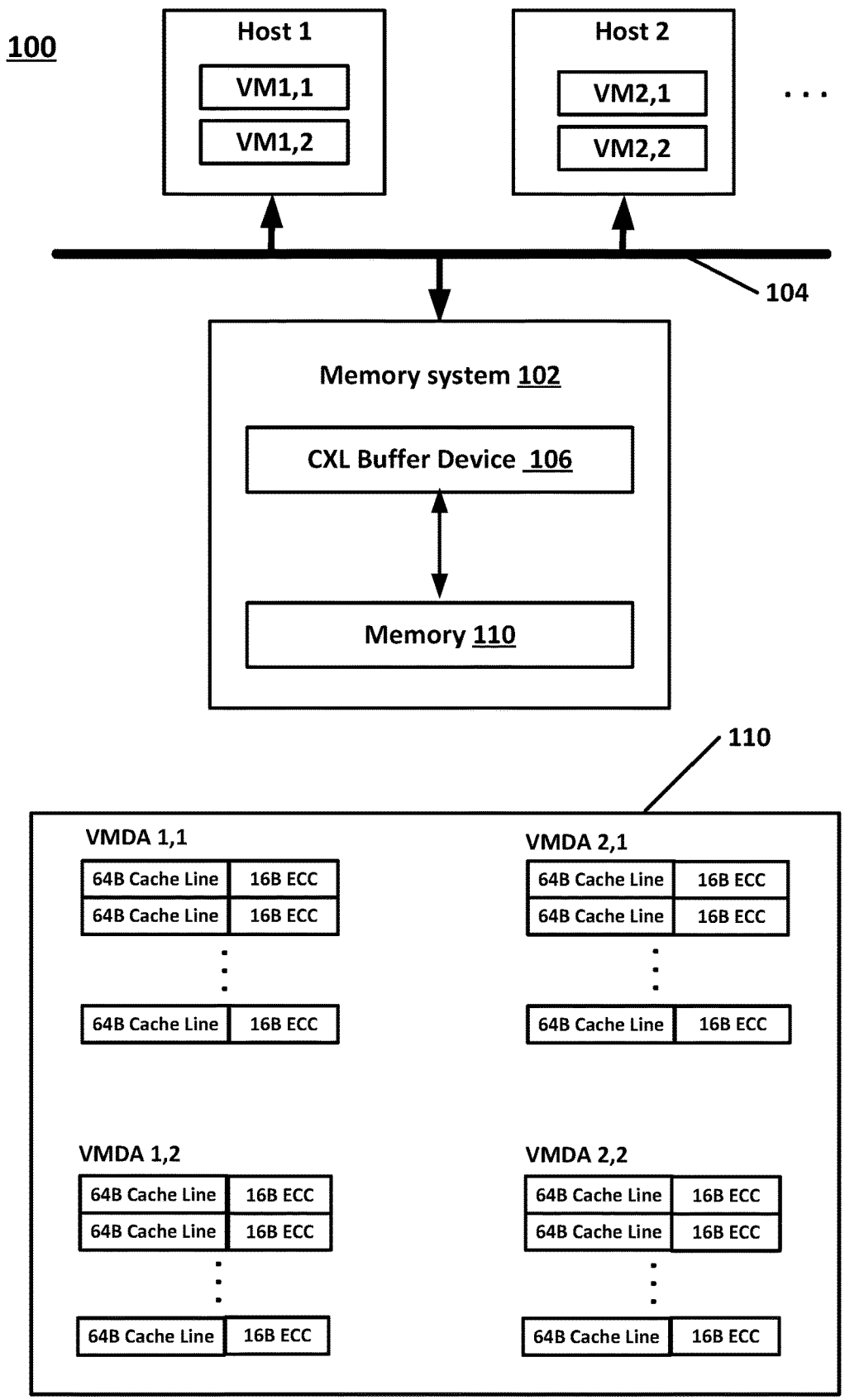
FIG. 1 is a block diagram illustrating relevant components of an example data center.

FIG. 1 is a block diagram that illustrates relevant components of an example data center 100. More specifically, data center 100 includes a plurality of hosts in data communication with a memory system 102 via a network 104. For ease of illustration and explanation FIG. 1 shows only two hosts, Host 1 and Host 2, it being understood data centers should not be limited to a pair of hosts. A host can implement one, two, or more virtual machines. The present disclosure will be described with reference to virtual machines it being understood the present disclosure should not be limited thereto. For ease of explanation and illustration Host 1 implements a pair of virtual machines VM1,1 and VM1,2, while Host 2 implements another pair of virtual machines VM2,1 and VM2,2, it being understood that hosts should not be limited to a pair of virtual machines.

Memory system 102 includes an integrated circuit (IC) buffer device 106 in data communication with memory 110. A buffer device is a IC chip that manages the flow of data going to and from memory. A buffer device can be integrated into a memory module along with memory. In an embodiment, buffer device 106 operates according to the Compute Express Link (CXL) protocol. CXL based memory modules allow host system memory bandwidth to be augmented.

Memory 110 stores data and metadata for each of the virtual machines. Metadata is data that provides information about other data. In FIG. 1, the metadata takes form in parity data such as error correction code (ECC), which can be used to correct errors introduced into data by unreliable memory. Other metadata types, such as security metadata that can be used to encrypt/decrypt and authenticate data, are contemplated.

FIG. 1 illustrates a graphical representation of an address space in memory 110. As shown subspaces in memory 110 are allocated to store data and metadata for each of the virtual machines VM1,1, VM1,2, VM2,1 and VM2,2. In the illustrated example, a subspace of 320 Megabytes (MB) of memory is allocated to store data and metadata for each of the virtual machines, 64 MB of which is allocated to store side-band ECC metadata in the illustrated example, it being understood that the size of memory allocations and the type of metadata should not be limited thereto. The side-band ECC metadata scheme is implemented in applications using Double Data Rate (DDR) dynamic random access memory (DRAM) (for example, DDR4 and DDR5). As the name illustrates, the ECC metadata is sent as side-band data along with its corresponding actual data to memory in a write operation or received as side-band data along with its corresponding actual data in a read operation. For instance, for a 64-bit data width, 8 additional bits are used for ECC access. Hence for DDR4 memories, memory channels are 72 bits wide. In contrast, in-band data access are memory transactions that do not use the extra 8 additional bits; the memory channel is 64 bits wide.

Each subspace has an offset address within the memory space. With continuing reference to FIG. 1, VM1,1 is allocated 320 MB of memory for data and side-band ECC metadata with an offset address VMDA1,1, VM1,2 is allocated 320 MB of memory for data and side-band ECC metadata with an offset address VMDA1,2, VM2,1 is allocated 320 MB of memory for data and side-band ECC metadata with an offset address VMDA2,1, and VM2,2 is allocated 320 MB of memory for data and side-band ECC metadata with an offset address VMDA2,2.

In operation, CXL buffer device 106 receives requests to read data from virtual machines. The requests include addresses for the requested data. The requests may also include identifications of the virtual machines that generated the requests. When CXL buffer device 106 receives a request to read data, CXL buffer device 106 translates the address of the request into a corresponding address in the address space for memory 110. Traditionally, data is accessed in 64B cachelines, and for the purposes of explanation only, data is also accessed in 64B cachelines, it being understood the present disclosure should not be limited thereto. CXL buffer device 106 uses the translated address to identify the location of the requested 64B data cacheline and its corresponding ECC metadata. Depending on the configuration of memory, the size of the corresponding ECC metadata varies. DDR5 40b sub-channels on dual inline memory modules (DIMM)s can provide 16B of ECC metadata per 64B cache line. DDR4 DIMM channels can provide 8B of ECC metadata per 64B cache line on a 72b wide interface. DDR5 DIMMs with 36b sub-channels can provide only 8B of metadata per 64B access. For purposes of explanation only 64B of data and 16B of ECC metadata are provided with each read request. Accordingly CXL buffer device 106 reads a 64B data cacheline and 16B of corresponding ECC metadata for each request. CXL buffer device 110 can use the 16B of ECC metadata to correct errors in its corresponding 64B data cacheline. CXL buffer device 106 returns a total of 64B of ECC corrected data to the virtual machine that requested the data.

Some but not all virtual machines in a data center may require metadata other than the ECC shown within FIG. 1. For example, a virtual machine may require security metadata for encrypting/decrypting data in addition to the ECC metadata. To address this need, the 16B of metadata mapped to each 64B cache line could be subdivided into 8B of ECC metadata and 8B of security metadata. While this solution fits into the existing configuration shown in FIG. 1, the solution reduces the error correction capability provided by 16B ECC. Alternatively, an additional amount (e.g., 8B) of security metadata can be allocated along with the 16B of ECC for each 64B data cacheline. But some virtual machines do not require the extra metadata. Nonetheless the CXL buffer device accesses 88B for each request it receives from a virtual machine, regardless of whether the 8B of extra security metadata is null data. This increases the memory, processing and transmission overhead in addition to an inefficient use of memory for storing null security metadata.

Figure 2:
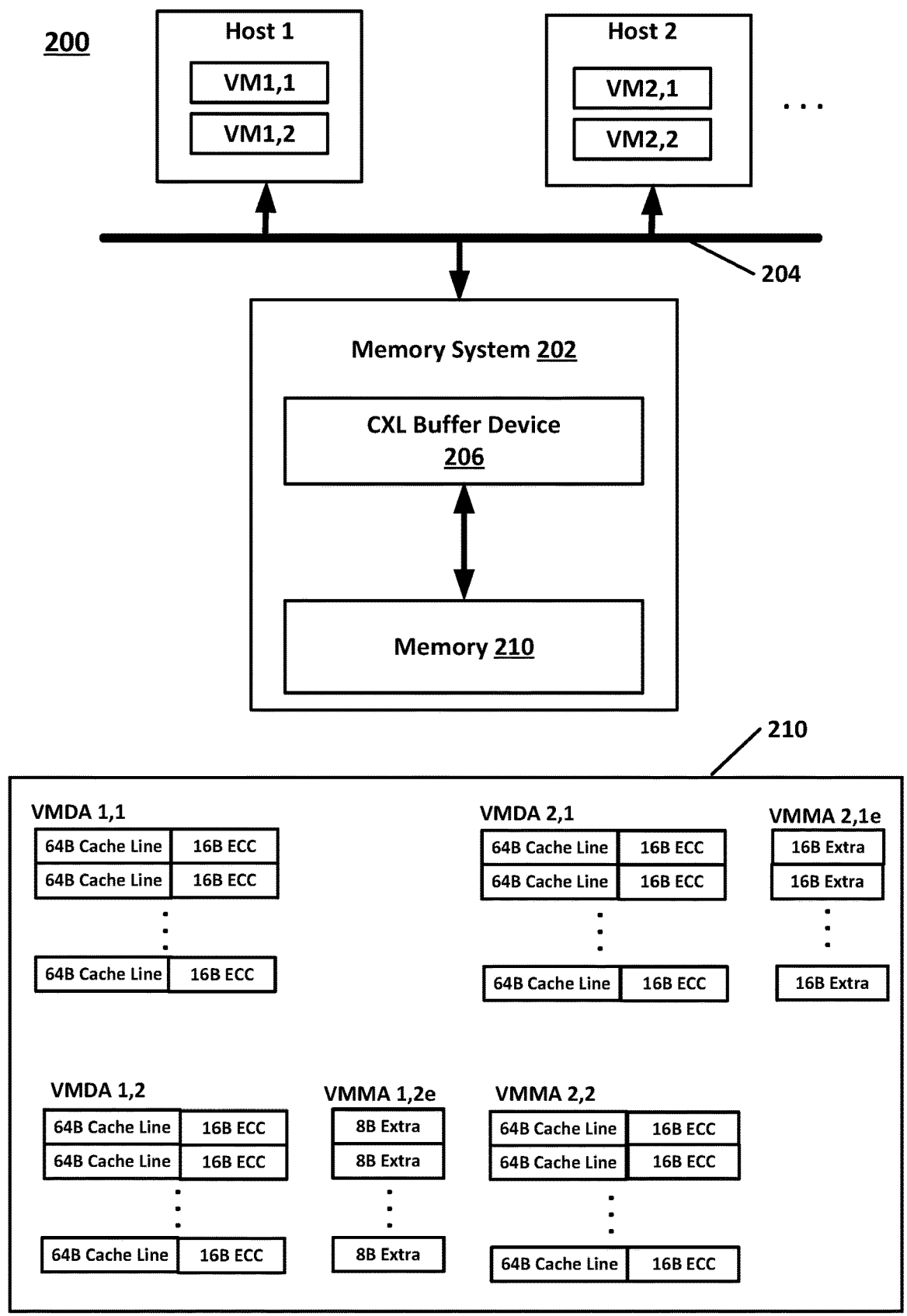
FIG. 2 is a block diagram illustrating relevant components of an example data center employing one embodiment of the present disclosure.

The present disclosure addresses these problems and others and provides a method and system for flexible metadata allocation and caching. FIG. 2 is a block diagram illustrating relevant components of an example data center 200 that employs one embodiment of the present disclosure. Data center 200 includes a plurality of hosts in data communication with a memory system 202 via a network 204. Memory system 202 includes a buffer device 206 in data communication with memory system 210. Buffer device 206 is configured to operate in accordance with the CXL protocol, it being understood that buffer device 206 can be configured to operate in accordance with other protocols such as the Open Memory Interface (OMI) protocol in another embodiment. For ease of illustration and explanation FIG. 2 shows only two hosts, Host 1 and Host 2. For ease of explanation and illustration Host 1 implements a pair of virtual machines VM1,1 and VM1,2, while Host 2 implements another pair of virtual machines VM2,1 and VM2,2, it being understood that hosts should not be limited to a pair of virtual machines.

FIG. 2 also illustrates a graphical representation of address space in memory 210. As shown subspaces in memory 210 are allocated to store data and metadata for each of the virtual machines VM1,1, VM1,2, VM2,1 and VM2,2. In addition, subspaces are allocated in memory 210 to store extra metadata (e.g., security metadata) for some but not all of the virtual machines.

As shown in FIG. 2 memory 210 is allocated to store data and side-band metadata for each of the virtual machines VM1,1, VM1,2, VM2,1 and VM2,2. In the illustrated example, a subspace of 320 MB is allocated store data for each of the virtual machines, 64 MB of which is allocated to store side-band ECC metadata, it being understood that memory allocations should not be limited thereto. Thus, VM1,1 is allocated 320 MB of memory for data and side-band ECC metadata with an offset address VMDA1,1, VM1,2 is allocated 320 MB of memory for data and side-band ECC metadata with an offset address VMDA1,2, VM2,1 is allocated 320 MB of memory for data and side-band ECC metadata with an offset address VMDA2,1, and VM2,2 is allocated 320 MB of memory for data and side-band ECC metadata with an offset address VMDA2,2.

Memory is also allocated for extra metadata. VM1,2 is allocated 32 MB of memory for extra, in-band metadata (e.g., security metadata) with an offset address VMMA1,2$e$, and VM2,1 is allocated 64 MB of memory for extra metadata with an offset address VMDA2,1$e$. The extra metadata stored for virtual machine VM2,1 may be divided between two or more types of metadata (e.g., security metadata, cache coherency metadata, data-poisoning metadata, and data-integrity metadata).

In operation, CXL buffer device 206 receives requests to read data from virtual machines. Each read request should have an address for requested data. When CXL buffer device 206 receives a request to read data from a virtual machine, CXL buffer device 206 translates the address of the request into a corresponding address within the space for memory 210. CXL buffer device 206 uses the translated addresses to read a 64B cacheline of data and its corresponding 16B of ECC metadata. Memory buffer/controller 206 corrects the cacheline of data using the corresponding ECC metadata. CXL buffer device 206 can also use the translated address to calculate an address in memory 210 where corresponding extra metadata is stored, if any. CXL buffer device 206 uses the calculated address to return the extra metadata, if any, to the requesting virtual machine. Alternatively, CXL buffer device 206 can process the ECC corrected data using the extra data. For example, CXL buffer device 206 can decrypt the ECC corrected data using extra security metadata. The decrypted, ECC corrected data can be returned to the requesting virtual machine. For purposes of explanation only the present disclosure will be described with reference to CXL buffer device 206 returning a 64B cacheline of ECC corrected data and extra metadata, if any, to the virtual machine that requested the data.

Figure 3:
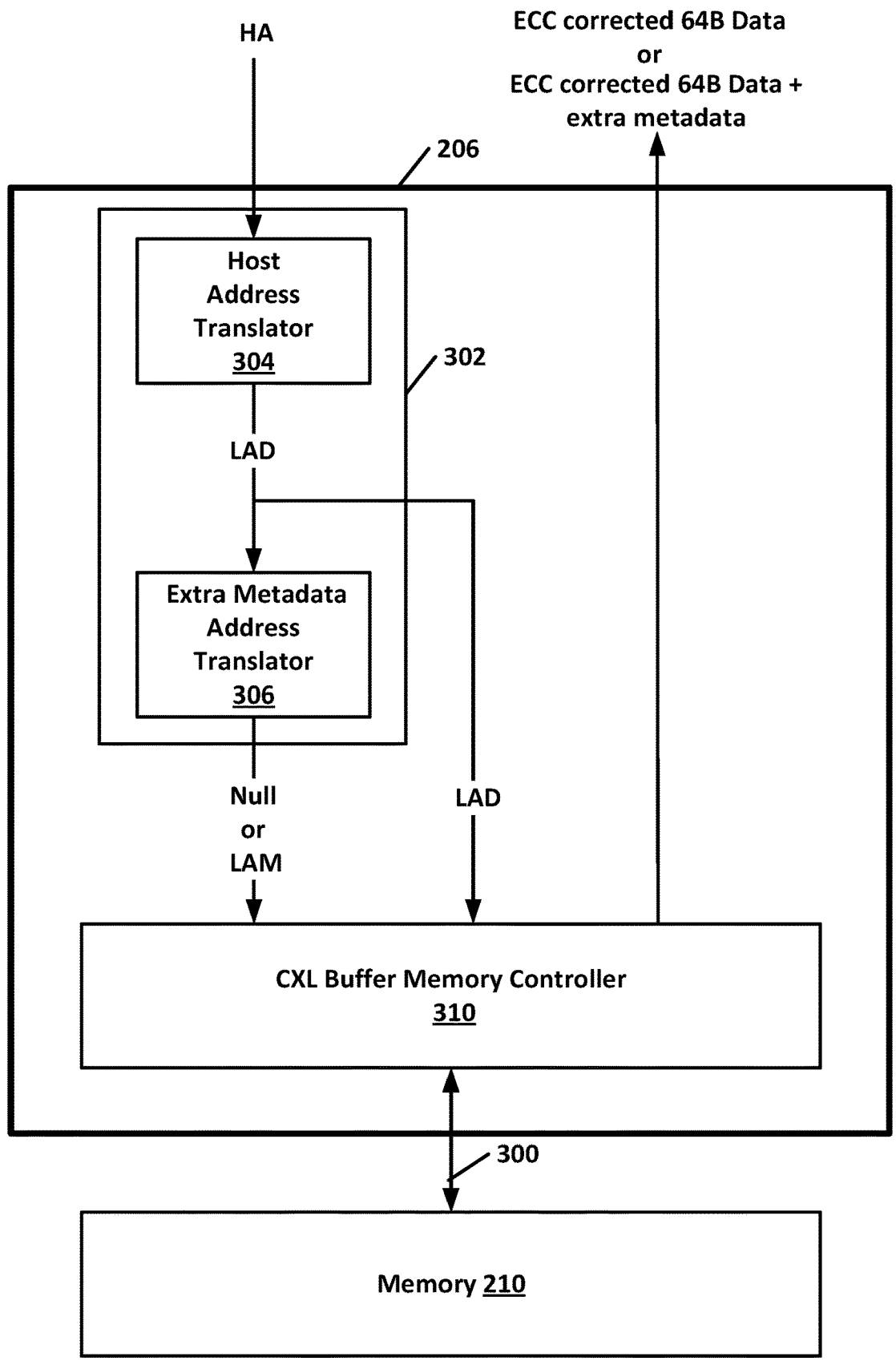
FIG. 3 is a block diagram of a CXL buffer device according to one embodiment of the present disclosure.

With continuing reference to FIG. 2, FIG. 3 illustrates relevant components of an example CXL buffer device 206 in data communication with memory 210 via an address/data bus 300. CXL buffer device 206 includes an address translation circuit 302, which receives read requests from any of the virtual machines VM1,1-VM2,2. Each read request includes a host address HA for requested data. Address translation circuit 302 includes a host address translator 304 that translates the host address HA into a logical address LAD. In addition, address translation circuit 302 includes an extra metadata address translator circuit 306 that uses the logical address LAD to generate a logical address LAM that corresponds to the extra metadata, if any. LAM and LAD are provided to CXL buffer memory controller 310, which accesses memory 210 to read the requested data and its corresponding ECC metadata at LAD, and the corresponding extra metadata, if any, at LAM. CXL buffer memory controller corrects the data cacheline returned from memory 210 using the corresponding ECC metadata. CXL buffer device 206 returns the ECC corrected data cacheline, and the corresponding extra metadata, if any, to the virtual machine that requested the data. In addition, or in an alternative embodiment, CXL buffer device 206 can cache a block (e.g., a 64B cacheline) of extra metadata in local memory as will be more fully described below.

Figure 4:
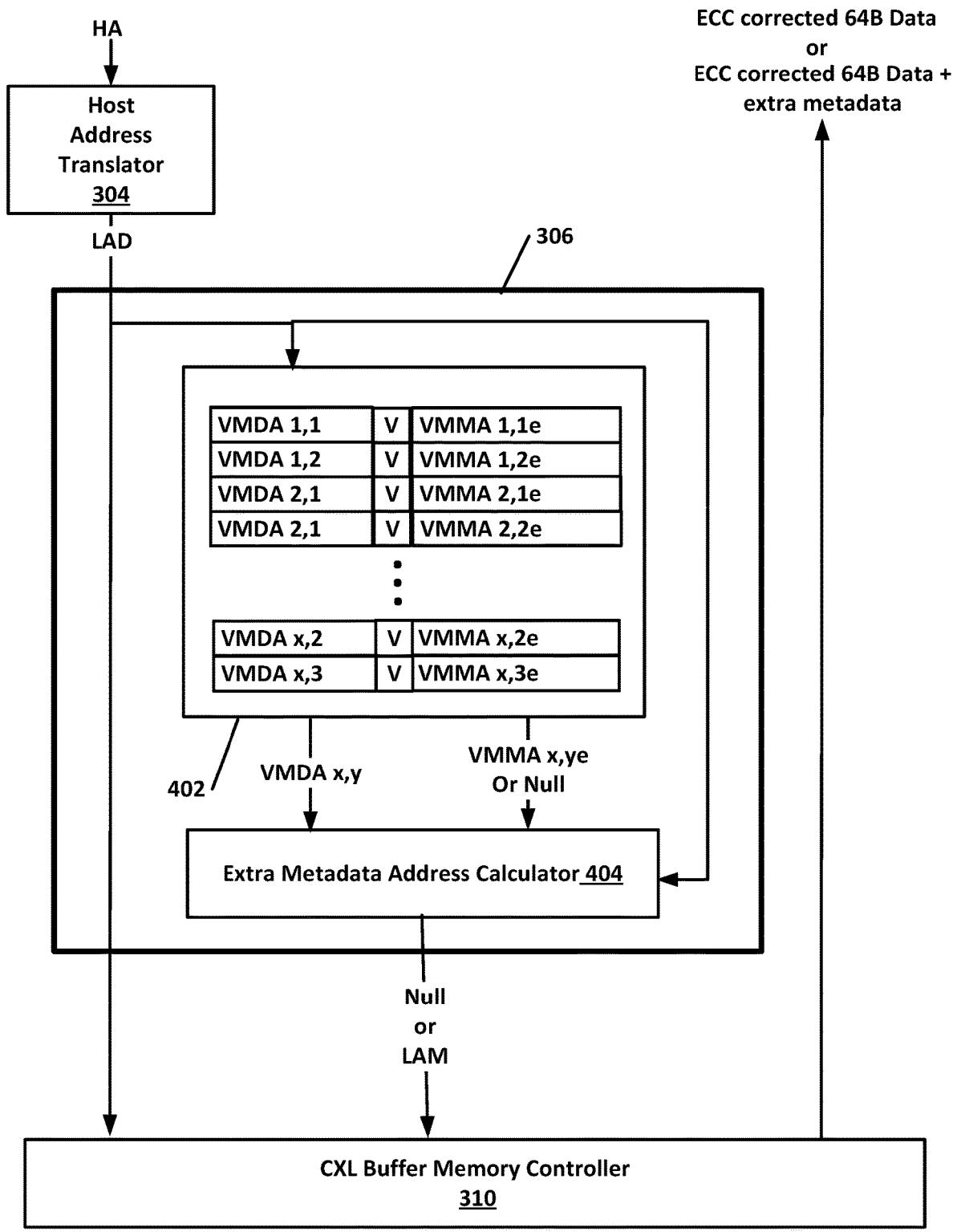
FIG. 4 is a block diagram that contains a more detailed illustration of an address generator shown in FIG. 3.

With continuing reference to FIGS. 2 and 3, FIG. 4 illustrates relevant components of one embodiment of the extra metadata address translator 306, which includes a translation table 402 and extra metadata logical address calculator 404. As noted above host address translation circuit 304 translates host addresses HAs into logical addresses LADs for data requested by virtual machines such as virtual machine VMA2,1. The logical addresses LADs are provided to a CXL buffer memory controller 310. In addition to providing the logical addresses LADs to the CXL buffer memory controller 310, the logical addresses LADs are provided to translation table 402 and extra metadata logical address calculator 404.

Translation table 402 maps memory offset addresses for respective virtual machines. In the illustrated example, each entry of table 402 maps VMDA x,y to VMMAx,ye for virtual machine VMx,y, where VMDA x,y is the offset address for the subspace in memory 110 that was allocated to store data for virtual machine VMx,y, and VMMAx,ye is the offset address for the subspace in memory 110 that was allocated to store extra metadata for virtual machine VMx,y. If no memory was allocated to store extra metadata for virtual machine VMx,y, VMMAx,ye is set to null data. In an alternative embodiment, translation table 402 maps an identity of a virtual machine VMx to offset address VMMAx,ye for the virtual machine. For purposes of explanation only, table 402 maps memory offset addresses for respective virtual machines.

Translation table 402 can be used to identify the offset address for a subspace that stores extra metadata corresponding to a cacheline of data D sought in a read request. Host address translation circuit 304 receives a host address HA of a read request for data D sought by a virtual machine. Host address translation circuit 304 translates HA into a logical address LAD. Control logic (not shown) compares LAD with ranges of addresses associated with table entries until the control logic finds a range in which LAD is contained. For example, control logic (not shown) can compare LAD with offset address VMDAx,y of an entry within table 402 and VMDAx,y+256M. If LAD is numerically between VMDAx,y and VMDAx,y+256M, the read request was received from virtual machine VMx,y. If the validity bit V of the table entry is set to logical 1, memory has been allocated to store extra metadata for virtual machine VMx,y, and as a result extra metadata offset VMMA x,ye is provided to extra metadata address calculator 404 for subsequent processing. Data offset VMDAx,y is also provided to extra metadata address calculator 404 for further processing. If validity bit V is set to logical zero, no memory has been allocated to store extra metadata for virtual machine VMx,y, and a null value is provided to extra metadata address calculator 404. If LAD is not numerically between VMDAx,y and VMDAx,y+256M, the control logic repeats the same procedure using the next entry of table 402.

Extra metadata address calculator 404 can calculate logical address LAM for the extra metadata corresponding to the requested data D using the logical address LAD, data offset address VMDAx,y provided by table 402, and extra metadata offset address VMMA x,ye, which is also provided by table 402. The relative position of data D in the subspace allocated to store data for VMx,y should be the same as the relative position of the corresponding metadata within the subspace allocated to store metadata for VMx,y, which is defined by offset VMMAx,ye. Accordingly, logical address LAD, offset VMDAx,y, and offset VMMAx,ye can be used to calculate the logical address LAM of the metadata corresponding to data D. CXL buffer memory controller 310 can use LAD to read data D and ECC metadata. CXL buffer memory controller 310 can use LAM to read the extra metadata corresponding to data D, if any, or a block (e.g., a cacheline) of extra metadata, if any, that includes the extra metadata corresponding to data D. CXL buffer device returns data D, the ECC metadata, and extra metadata, if any, or utilizes the metadata as needed to perform the necessary function (e.g. decryption).

With continuing reference to FIGS. 2-4, FIG. 6 is a process that shows relevant aspects of an example method implemented by control logic (not shown) for accessing data and/or corresponding extra metadata using translation table 402 and extra metadata address calculator 404. The process of FIG. 6 begins when CXL buffer device 206 receives a request from a virtual machine to read data D in memory 210. The request includes host address HA for the data, which in turn is provided to host address translation 304 as shown in step 602. In step 604 host address translation 304 translates the host address HA into a corresponding logical data address LAD. Then in step 606, a determination is made as to whether a valid, extra metadata exists in memory, which corresponds to requested data D. The control logic uses translation table 402 as noted above in order to determine whether valid, extra metadata exists. If valid, extra metadata does not exist, then in step 612 CXL buffer memory controller 310 reads data D and corresponding ECC metadata. CXL buffer memory controller 310 corrects data D using the corresponding ECC metadata. In step 614, the ECC corrected data D is returned to the requesting virtual machine. If, however, valid metadata exists for data D, the process proceeds to step 616 in which the control logic calculates the metadata logical address LAM using LAD as noted above. CXL buffer memory controller 310 uses LAD to read data D and the corresponding ECC metadata. CXL buffer memory controller 310 corrects data D using the corresponding ECC metadata. CXL buffer memory controller 310 uses LAM to read the corresponding extra metadata. In step 622 ECC corrected data D, and corresponding extra metadata is returned to the virtual machine that requested data D.

Figure 5:
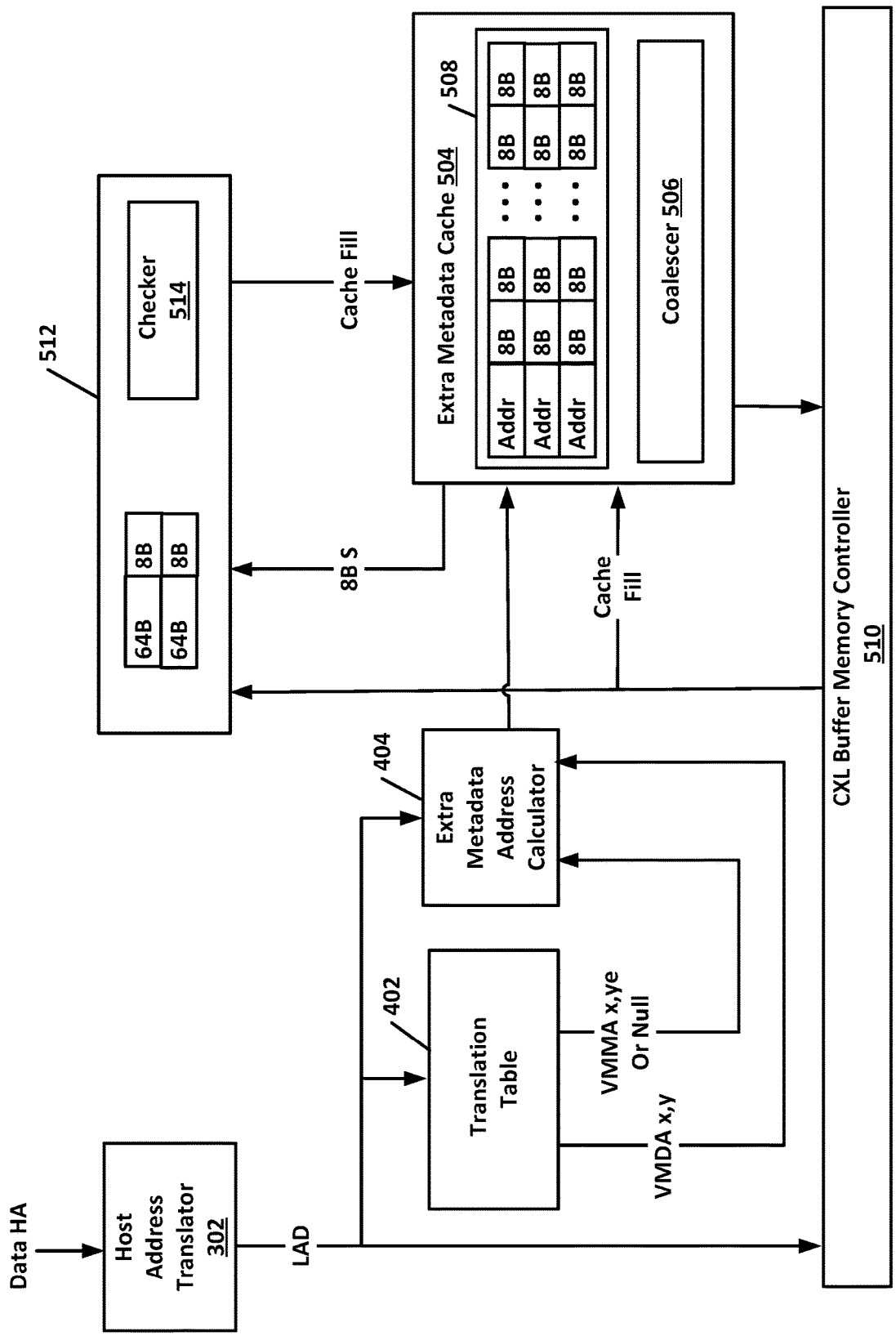
FIG. 5 is a block diagram illustrating a block diagram of a CXL buffer device according to another embodiment of the present disclosure.
Figure 6:
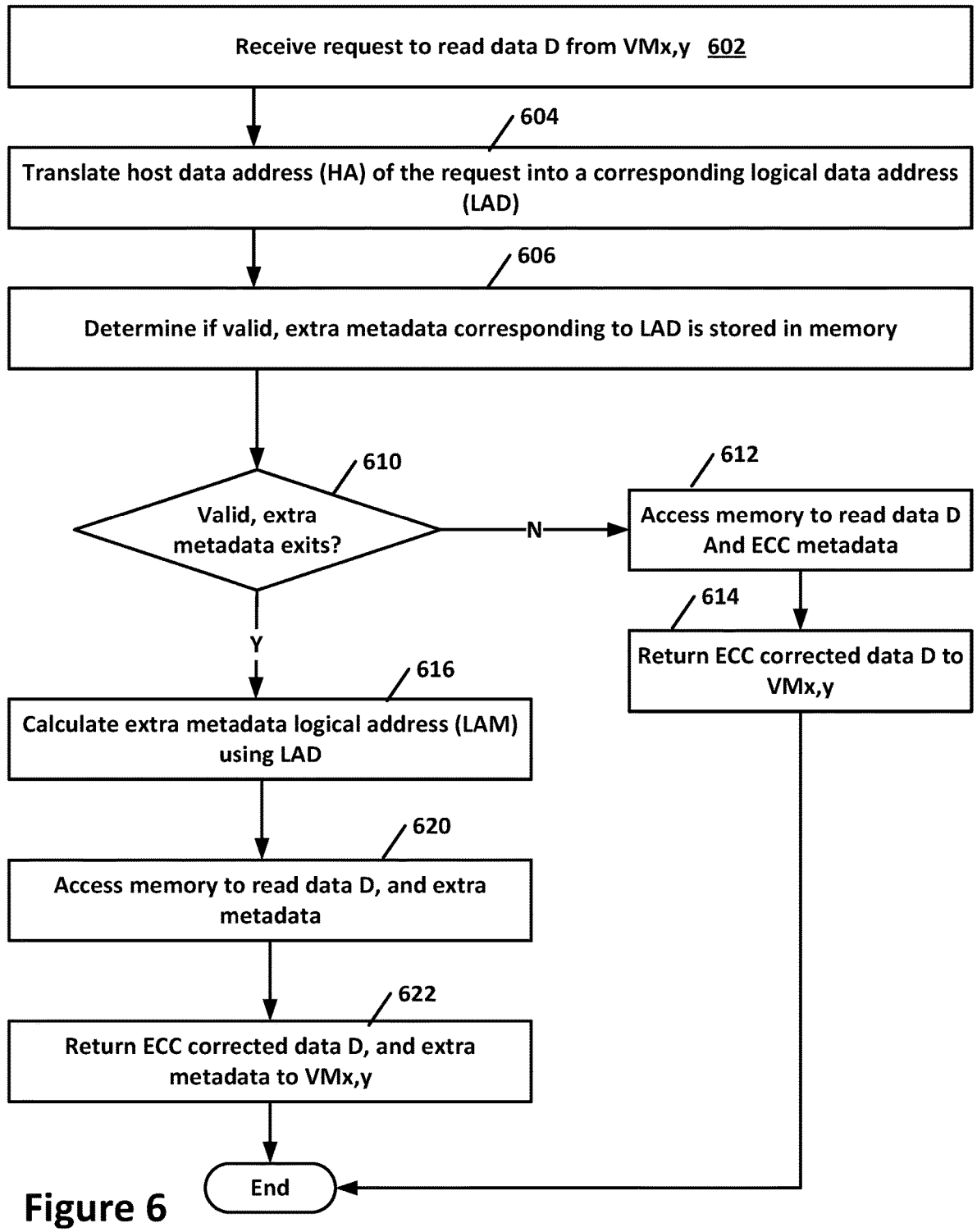
FIG. 6 is a flowchart illustrating relevant operational aspects of a method according to one embodiment of the present disclosure.

FIGS. 4 and 6 illustrates an apparatus and method for returning data and corresponding metadata to a requesting virtual machine from a memory with flexible metadata allocation. In another embodiment of the present disclosure, cachelines containing extra metadata can be read from memory in response to a request to receive data from a virtual machine. The cachelines of metadata can be stored in local memory of a metadata cache. The cachelines of extra metadata can be accessed to respond to subsequent requests for data from the virtual machines. With continuing reference to FIG. 2, FIG. 5 illustrates an alternative embodiment to CXL buffer device 206, which includes an extra metadata cache 504. The embodiment of FIG. 5 includes many of the same components of the memory buffer/controller shown in FIG. 4. For example, both include a host address translator circuit 302, a translation table 402, and extra metadata address calculator 404. However, the memory buffer/controller of FIG. 5 includes extra metadata cache 504, which in turn includes a coalescer 506 and a cache memory 508 for storing 64B cachelines of extra metadata. Each cacheline of extra metadata is tagged with a respective "Addr" identifier, which can be a portion of the logical address in memory 210 where the cacheline of extra metadata is also stored.

Translation table 402 and extra metadata address calculator 404 operate in substantially the same manner as described above. Namely, translation table 402 and extra metadata address calculator 404 operate in concert in order to translate LAD, the logical address for data D requested by a virtual machine, into the logical address LAM in memory for the corresponding extra metadata, if any. However, rather than providing LAM to CXL buffer memory controller 510 as is done in the memory buffer/controller of FIG. 4, LAM is provided to extra metadata cache 504. Control logic of metadata cache 504 compares a portion of LAM to tag identifiers Addr for blocks of extra metadata in cache 504. If a match is detected, the extra metadata corresponding to data D is contained in the cache and can be read and returned to the requesting virtual machine, or the extra metadata can be provided to and used locally by checker module 514. If no match is detected, the coalescer forwards the LAM to CXL memory controller 510, which reads 64B of extra metadata. The 64B of extra metadata read by CXL buffer memory controller 510 is sent to cache 504 where it is stored as a cacheline in cache memory 508.

CXL memory controller 510 in FIG. 5 receives the logical address for data LAD from host translator circuit 302. CXL buffer memory controller 510 uses this address to read data D and the ECC metadata corresponding thereto. CXL memory controller 510 corrects data D using the corresponding ECC metadata. ECC corrected data D can be provided to data checker circuit 512, which includes a checker module 514 that can check ECC corrected data D using the extra metadata corresponding thereto and provided by the extra metadata cache 504.

Figure 7:
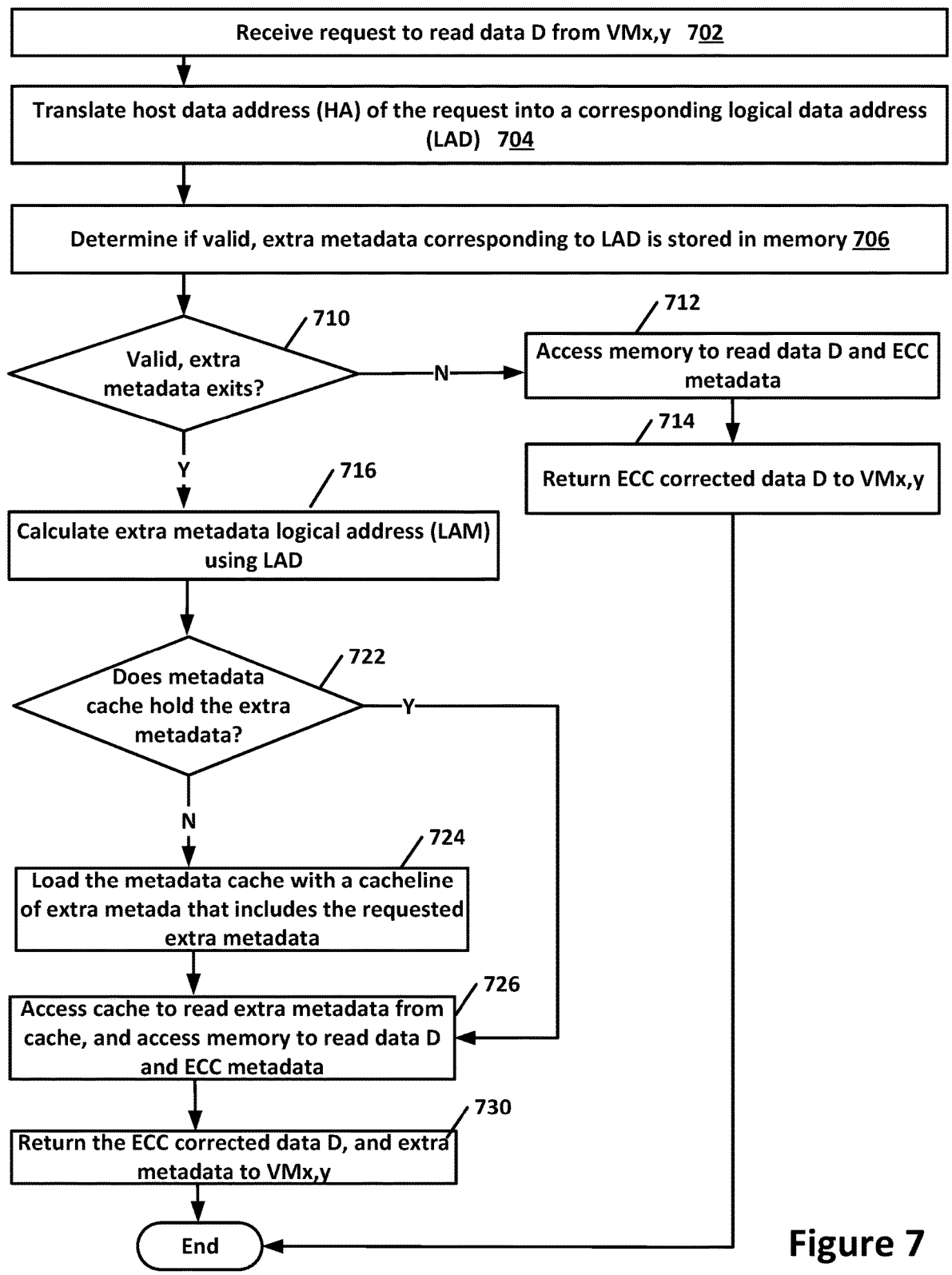
FIG. 7 is a flowchart illustrating relevant operational aspects of a method according to another embodiment of the present disclosure.

With continuing reference to FIGS. 2 and 5, FIG. 7 is a process that shows relevant aspects of an example method implemented by control logic (not shown) for accessing data and/or corresponding extra metadata using extra metadata cache 504. The process of FIG. 7 begins with step 702 when the memory buffer/controller receives a request from a virtual machine to read data D in memory 210. The request includes host address HA for the data, which in turn is provided to host address translation 304. In step 704 host address translation 304 translates the host address HA into a corresponding logical data address LAD. Then in step 706, a determination is made as to whether a valid, extra metadata exists in memory, which corresponds to requested data D. The control logic can use translation table 402 as noted above to determine whether valid, extra metadata exists. If valid, extra metadata does not exist, then in step 712 CXL memory controller 510 reads data D and corresponding ECC metadata from memory 210. CXL memory controller 510 corrects data D using the corresponding ECC metadata. In step 714, the ECC corrected data is returned to the requesting virtual machine. If, however, valid extra metadata exists for data D, the process proceeds to step 716 in which the control logic calculates the metadata logical address LAM using LAD as noted above. Control logic of metadata cache 504 uses LAM to determine whether cache 504 has a copy of the requested extra metadata. If not, CXL buffer memory controller 510 accesses memory 210 to read a 64B cacheline of extra metadata that contains the requested extra metadata. Metadata cache 504 receives and stores the extra metadata cacheline read by CXL buffer memory controller 510. If the control logic of metadata cache 504 determines that cache 504 has a copy of the requested extra metadata in step 722, or in response to storing the 64B extra metadata cacheline in cache 504, the requested extra metadata is read from the cache in step 726. In addition, CXL buffer memory controller 510 uses LAD to read data D and the corresponding ECC metadata in step 726. CXL buffer memory controller 310 corrects data D using the corresponding ECC metadata. CXL buffer memory controller 510 uses LAM to read the corresponding extra metadata. In step 730 ECC corrected data D, and corresponding extra metadata is returned to the virtual machine that requested data D.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. A method of operation of a memory buffer integrated circuit (IC) device, comprising:
receiving first and second requests from first and second applications, respectively, wherein the first and second requests specify a reading of first and second data, respectively, from one or more memory devices;
receiving from the one or more memory devices, the first and second data in response to the first and second requests;
receiving first and second metadata from the one or more memory devices in response to the first and second requests;
wherein the first and second metadata correspond to the first and second data, respectively;
wherein first and second data are equal in size, and;
wherein the first and second metadata are unequal in size.

2. The method of claim 1 wherein the first and second applications are executing on first and second processors, respectively, or on one processor.

3. The method of claim 1 wherein memory allocated to store the first metadata for the first application is larger than memory allocated to store the second metadata for the second application.

4. The method of claim 1 wherein the first metadata is parity metadata, and the second metadata is security metadata.

5. The method of claim 1 further comprising:
receiving requests from a third application to read data from the one or more memory devices;
receiving data from the one or more memory devices for each request received from the third application;
wherein no metadata is received from the one or more memory devices in response to receiving the requests from the third application.

6. The method of claim 1 further comprising:
accessing a table to read first information that is mapped to an identification of the first application, wherein the first information can be used to calculate a first address in the one or more memory devices where the first metadata is stored;
accessing the table to read second information that is mapped to an identification of the second application, wherein the second information can be used to calculate a second address in the one or more memory devices where second metadata is stored.

7. The method of claim 1 further comprising:
accessing a table to read first information that is mapped to a first range of memory addresses allocated to the first application, wherein the first information can be used to calculate a first address in the one or more memory devices where the first metadata is stored;
accessing the table to read second information that is mapped to a second range of memory addresses mapped to the second application, wherein the second information can be used to calculate a second address in the one or more memory devices where second metadata is stored.

8. The method of claim 1 wherein the first metadata is read from a first cache.

9. The method of claim 1 further comprising:
allocating respective, non-overlapping memory subspaces of the one or more memory devices to store data of the first application and metadata corresponding to the data of the first application.

10. The method of claim 1 further comprising:
allocating a memory subspace of the one or more memory devices to store data of the first application and metadata corresponding to the data of the first application so that the data and metadata can be fetched sequentially.

11. A memory buffer integrated circuit (IC) device comprising:
a first circuit configured to receive first and second requests for first and second data, respectively, from first and second applications, respectively, wherein the first circuit is further configured to translate first and second addresses for the first and second data, respectively, into first and second addresses for first and second metadata, respectively, corresponding to the first and second data, respectively;
a second circuit configured to receive the first and second data from one or more memory devices in association with the first and second requests, respectively, and to read the first and second metadata from the one or more memory devices;
wherein the first and second data are equal in size, and;
wherein the first and second metadata are unequal in size.

12. The memory buffer IC of claim 11 further comprising:
an instruction memory for storing instructions;
a processor configured to execute the instructions, wherein the processor is configured to implement a method in response to executing the instructions, the method comprising:
allocating first and second address spaces in the one or more memory devices where data of the first and second applications, respectively, can be stored;
allocating third and fourth address spaces in the one or more memory devices where metadata for the first and second applications, respectively, can be stored;
wherein the third and fourth spaces are unequal in size.

13. The memory buffer IC of claim 11 wherein the first and second applications are executing on first and second processors, respectively.

14. The memory buffer IC of claim 11 wherein the first metadata is parity metadata, and the second metadata is security metadata.

15. The memory buffer IC of claim 11 further comprising:
wherein the first circuit is configured to receive requests from a third application to read data from the memory;
wherein the second circuit is configured to read data from the one or more memory devices for each request the first circuit receives from the third application;
wherein the second circuit is not configured to read metadata from the one or more memory devices in response to first circuit receiving the requests from the third application.

16. The memory buffer IC of claim 11 wherein the first circuit comprises:
a table configured to map first information to an identification of the first application, and second information to an identification of the second application;
wherein the first information can be used to calculate a first address in the one or more memory devices where the first metadata is stored;
wherein the second information can be used to calculate a second address in the one or more memory devices where second metadata is stored.

17. The memory buffer IC of claim 11 wherein the first circuit comprises:
a table configured to map first information to an offset address for a memory space allocated to the first application, and second information to an offset address for a memory space allocated to the first application;
wherein the first information can be used to calculate a first address in the one or more memory devices where the first metadata is stored;

wherein the second information can be used to calculate a second address in the one or more memory devices where second metadata is stored.

18. A memory buffer integrated circuit (IC) device comprising:
a first circuit configured to receive requests to read data from one or more memory devices, wherein the requests are received from a plurality of applications, wherein the first circuit further configured to translate addresses for some but not all of the data into addresses for corresponding metadata;
a second circuit for reading the data from the one or more memory devices, and for reading metadata for some but not all of the data from the one or more memory devices.

19. The memory buffer IC of claim 18 further comprising:
an instruction memory for storing instructions;
a processor configured to execute the instructions, wherein the processor is configured to implement a method in response to executing the instructions, the method comprising:
allocating respective address spaces in the one or more memory devices where data of the plurality of applications can be stored;
allocating respective address spaces in the one or more memory devices where metadata for some but not all of the plurality of applications can be stored.

20. The memory buffer IC of claim 18 wherein the first circuit comprises:
a table configured to map identifications of the plurality of applications to a plurality of bits, respectively, and to a plurality of address translation values, respectively;
wherein the first circuit translates addresses using only the address translation values that are mapped to respective bits that are set to a first state in the table.

21. The memory buffer IC of claim 18 wherein the first circuit comprises:
a table configured to map a plurality of offset addresses of memory spaces allocated to the plurality of applications, respectively, to a plurality of bits, respectively, and to a plurality of address translation values, respectively;
wherein the first circuit translates addresses using only the address translation values that are mapped to respective bits that are set to a first state in the table.

22. The memory buffer IC of claim 18 wherein the first circuit comprises:
a table configured to map a plurality of address ranges, respectively, to a plurality of bits, respectively, and to a plurality of address translation values, respectively;
wherein the first circuit translates addresses using only the address translation values that are mapped to respective bits that are set to a first state in the table.

* * * * *